United States Patent
Kirby et al.

(10) Patent No.: US 7,923,689 B2
(45) Date of Patent: Apr. 12, 2011

(54) MULTI-BAND SUB-WAVELENGTH IR DETECTOR HAVING FREQUENCY SELECTIVE SLOTS AND METHOD OF MAKING THE SAME

(75) Inventors: Deborah J. Kirby, Calabasas, CA (US); Terence J. De Lyon, Newbury Park, CA (US); David T. Chang, Calabasas, CA (US); Frederic P. Stratton, Beverly Hills, CA (US); Daniel J. Gregoire, Thousand Oaks, CA (US); Jeffery J. Puschell, Solvang, CA (US)

(73) Assignee: Raytheon Company, Waltham, MA (US)

( * ) Notice: Subject to any disclaimer, the term of this patent is extended or adjusted under 35 U.S.C. 154(b) by 64 days.

(21) Appl. No.: 12/433,631

(22) Filed: Apr. 30, 2009

(65) Prior Publication Data

US 2010/0276595 A1    Nov. 4, 2010

(51) Int. Cl.
*G01J 5/02* (2006.01)
(52) U.S. Cl. ................ 250/339.02; 250/339.01
(58) Field of Classification Search ......... 250/339.01, 250/339.02
See application file for complete search history.

(56) References Cited

U.S. PATENT DOCUMENTS

| 5,306,386 | A | 4/1994 | De Lyon |
| 5,399,206 | A | 3/1995 | de Lyon |
| 7,289,422 | B2 | 10/2007 | Rettner et al. |
| 7,456,383 | B2 | 11/2008 | Kim et al. |
| 2003/0103150 | A1 | 6/2003 | Catrysse et al. |
| 2005/0121599 | A1 | 6/2005 | Mouli |
| 2005/0233493 | A1 | 10/2005 | Augusto |
| 2005/0275934 | A1 | 12/2005 | Ballato et al. |
| 2006/0018211 | A1 | 1/2006 | Ueyanagi et al. |
| 2006/0175551 | A1 | 8/2006 | Fan et al. |
| 2007/0194999 | A1 | 8/2007 | Morton |
| 2008/0217542 | A1 | 9/2008 | Verma et al. |
| 2009/0108203 | A1 | 4/2009 | Gregoire et al. |

FOREIGN PATENT DOCUMENTS

GB    2348539 A    10/2000

OTHER PUBLICATIONS

Robert C. Keller, et al. "Reaction Chemistry and Resulting Surface Structure of HgCdTe Etched in CH4/H2 and H2 ECR Plasmas"; Journal of Electronic Materials, vol. 24, No. 9, 1995, pp. 1155-1160.
Robert C. Keller, et al. "Dry Etching of Hg1-xCdTe Using CH4/H2/Ar/N2 Electron Cyclotron Resonance Plasmas"; Journal of Electronic Materials, vol. 25, No. 8, 1996, pp. 1270-1275.
J.D. Benson, et al. "The Influence of Photoresist Feature Geometry on ECR Plasma Etched HgCdTe Trenches"; Materials for infrared Detectors II, Proceedings of SIPE, vol. 4795, 2002, pp. 129-135.
European Search Report dated Aug. 12, 2010 of EP Appln. No. 10160055.9 filed Apr. 15, 2010 (10 pages).

*Primary Examiner* — David P Porta
*Assistant Examiner* — Mark R Gaworecki
(74) *Attorney, Agent, or Firm* — Pillsbury Winthrop Shaw Pittman LLP

(57) ABSTRACT

In one embodiment, a multiband infrared (IR) detector array includes a metallic surface having a plurality of periodic resonant structures configured to resonantly transmit electromagnetic energy in distinct frequency bands. A plurality of pixels on the array each include at least first and second resonant structures corresponding to first and second wavelengths. For each pixel, the first and second resonant structures have an associated detector and are arranged such that essentially all of the electromagnetic energy at the first wavelength passes through the first resonant structure onto the first detector, and essentially all of the electromagnetic energy at the second wavelength passes through the second resonant structure onto the second detector. In one embodiment, the resonant structures are apertures or slots, and the IR detectors may be mercad telluride configured to absorb radiation in the 8-12 μm band. Detection of more than two wavelengths may be achieved by proper scaling. A method of forming an IR detector array is also disclosed.

15 Claims, 3 Drawing Sheets

30

MULTI-BAND SUB-WAVELENGTH IR DETECTOR HAVING FREQUENCY SELECTIVE SLOTS AND METHOD OF MAKING THE SAME

BACKGROUND

This application generally relates to IR detectors, and in particular, to a multiband sub-wavelength IR detector having frequency selective slots, and a method of making the same.

Imaging systems typically use an array of detectors to generate an image of a target. Each individual detector element measures the intensity of energy (such as infrared or visible light) incident upon the detector element, and forms one pixel of the output image.

Mercury cadmium ("mercad") telluride has been implemented as an absorbing element for IR detectors. By varying the alloy composition of the structure, the cut-off wavelength may be selectively tuned so as to provide broad band coverage in the long-wavelength infrared (LWIR) range (8-12 µm).

GaN and GaAs/AlGaAs quantum well infrared photodetector (QWIP) technologies have been considered for broad band LWIR response. However, the quantum efficiency at 10 µm for these systems is significantly low as they require extrinsic doping. Further, this type of detector is not readily combinable with a frequency-selective surface to enable multiple or dual band detection.

What is needed is an easily manufactured planar array with dual or multiband imaging response that overcomes the shortcomings of conventional imaging arrays.

SUMMARY

According to one embodiment, a multiband infrared (IR) detector array includes a metallic surface having a plurality of periodic resonant structures, each periodic structure configured to resonantly transmit electromagnetic energy in a distinct frequency band; and a plurality of pixels each comprising at least first and second resonant structures corresponding to first and second wavelengths, respectively, wherein, for each pixel, the first and second resonant structures each have respective first and second detectors associated therewith, wherein the first and second resonant structures are arranged such that essentially all of the electromagnetic energy at the first wavelength passes through the first resonant structure onto the first detector and essentially all of the electromagnetic energy at the second wavelength passes through the second resonant structure onto the second detector. The first and second detectors may include various alloys of mercury cadmium telluride.

According to another embodiment, a method of forming a multiband infrared (IR) detector array includes forming an IR absorber material on a substrate; forming a plurality of mesas in the absorber material; depositing an oxide layer on the substrate; and forming a metallic surface on the oxide layer so as to define a pixel comprising a plurality of apertures each having a length associated therewith, wherein each aperture is associated with one of the plurality of mesas, wherein the length of each aperture in the pixel is selected to be resonant to one of a plurality of different IR wavelengths.

Other features of various embodiments of this disclosure will become apparent from the following detailed description, the accompanying drawings, and the appended claims.

BRIEF DESCRIPTION OF THE DRAWINGS

Exemplary embodiments of this disclosure will now be discussed with reference to the accompanying drawings wherein corresponding reference symbols indicate corresponding parts, in which.

DETAILED DESCRIPTION

Figure 1:
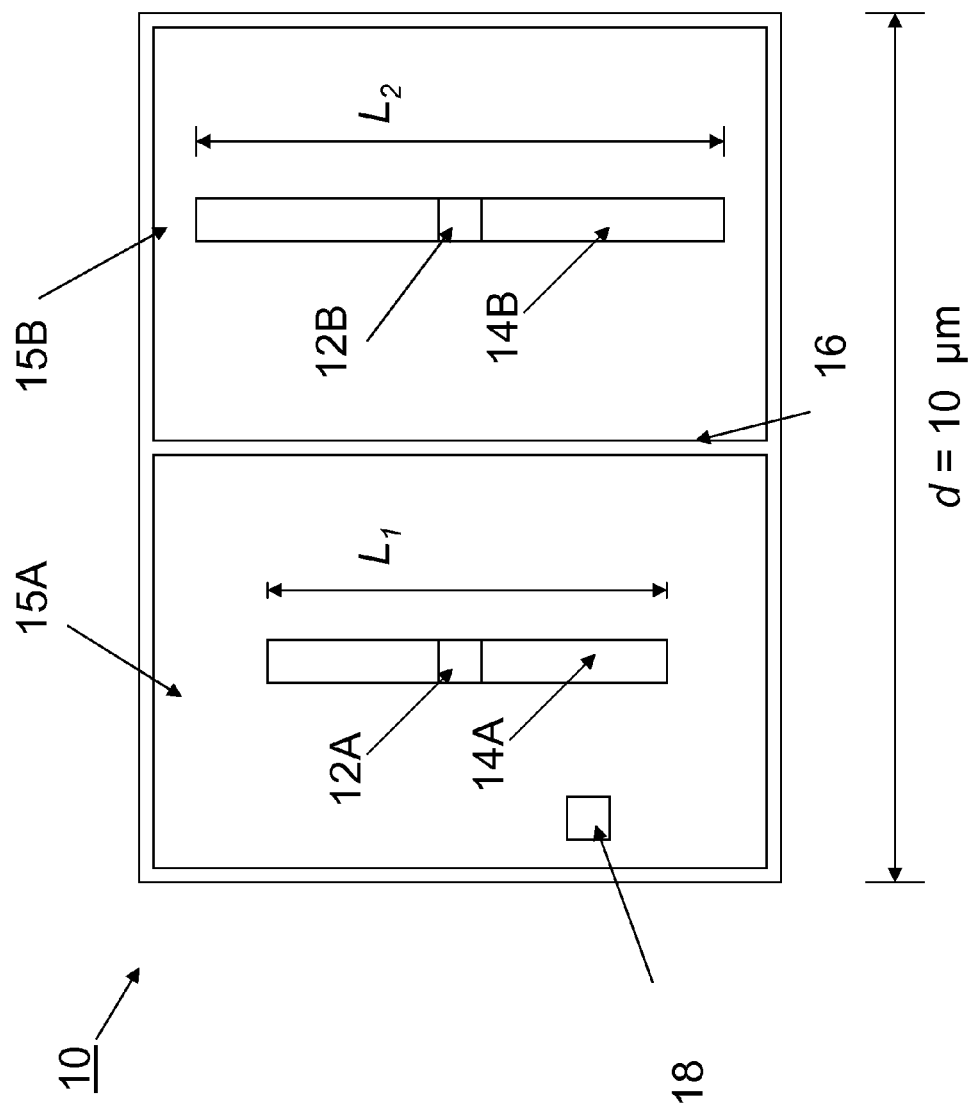
FIG. 1 is a top view of an exemplary optical detector pixel element in accordance with an embodiment.

FIG. 1 is a top view of an exemplary optical detector pixel element 10 in accordance with an embodiment.

Pixel element 10 may be generally rectangular (or square) in cross-section having a side of length d. In the illustrative embodiment, d is approximately equal to about 1 wavelength, for a representative frequency of the detectable bands. In use, pixel element 10 may be arranged such that light (radiation) will illuminate its top surface.

According to an embodiment, pixel element 10 is configured to simultaneously detect multiple frequency bands within a single pixel element. While one pixel element 10 is shown, pixel element 10 may be part of an imaging array, comprising a plurality of pixel elements 10 where each pixel element 10 detects the optical intensity incident on the pixel area. In one embodiment, pixel element 10 collects the light incident on an area approximately 1 wavelength square (d×d).

Pixel element 10 includes metallic surfaces 15 (15A, 15B) having a plurality of resonant apertures 14 (14A, 14B) and detector elements 12 (12A, 12B) positioned under each aperture 14. Detectors 12 are sensitive to a particular frequency band by filtering the incident radiation through a resonant aperture 14 positioned above the detector element 12. The light within each sub-band, as determined by the filtering by the resonant apertures 14 (14A, 14B), is transmitted through its respective filtering aperture 14 and detected by its respective detector element 12 (12A, 12B).

Each resonant aperture 14 is adapted to collect light incident on pixel element 10 and resonantly transmit the light in a distinct frequency band to its respective detector 12. Resonant aperture 14 collects energy incident on an area much larger than aperture 14 and focuses the radiation into a smaller, localized region within aperture 14 (e.g., detector 12 may be placed in this region). This allows the use of detector 12 that is much smaller than the pixel element 10 area. In the illustrative embodiment, resonant apertures 14A, 14B collect radiation incident on metallic surfaces 15 (15A, 15B) across an area of approximately 1 wavelength square, for a representative frequency of the energy allowed by the aperture 14 (14A, 14B). For IR light, for example, the dimension d may be about 10 µm. However, it will be appreciated that the present teachings may also be applied to other types of electromagnetic energy, including visible light and ultraviolet light.

Since resonant apertures 14 and detectors 12 are smaller than the pixel area, multiple apertures 14 and detectors 12 can be placed in pixel element 10. Conventional imaging arrays, by contrast, typically have only a single detector element per pixel because the detector size is typically equal to the pixel size. In one embodiment, multiple resonant apertures 14 of pixel element 10 collect energy from approximately the same area, but energy in different frequency bands are funneled through different apertures 14 to multiple detectors 12, with each detector adapted to detect a different frequency band.

In the illustrative embodiment, metallic surface 15 may separated into distinct portions 15A, 15B, separated, for example, by an oxide 16, corresponding to each aperture 14

(although this need not be the case). The metallic surface 15 may be formed of a layer of metal, such as gold (Au). If the top surface metal is split by oxide 16, then the output of each detector 12 may be accessed individually (i.e., a first frequency band f1 is measured separately from a second frequency band f2). If, however, the surface remains continuous (i.e., no oxide split) the pixel responds to both frequency bands f1 and f2, and detected signals due to frequency bands f1 and f2 may not be resolved.

Each detector 12 may include a photodetector material adapted to absorb light transmitted by their respective apertures 14 and convert the received energy to an electrical signal. The detector material may be configured to detect signals in the infrared (IR) spectrum. In one embodiment, the IR absorber material may be mercury cadmium telluride (also known as "mercad" telluride, MCT or HgCdTe), which may be selectively tuned to absorb electromagnetic radiation, for example, between 8-12 μm. Detectors 12 may be connected to readout electronics 30 (FIG. 3), which perform image processing on the detector output signals to form one or more output images.

In the illustrative embodiment, each aperture 14 of pixel element 10 is configured to transmit energy in a different frequency band so that each detector 12 of the pixel element 10 receives and detects a different frequency band. Electronics combine the signals from the detectors 12 to generate images that show the intensity of energy received in each pixel in the different frequency bands. In FIG. 1, pixel element 10 is configured as a dual-band detector, having two detector 12A, 12B. The first aperture 14A and first detector 12A are configured to detect a first frequency band f1, and the second aperture 14B and second detector 12B are configured to detect a second frequency band f2.

In an array of pixel elements 10, signals from first detectors 12A may be combined by the electronics to form a first image (showing the intensity of energy in the first frequency band f1) and the signals from second detectors 12B of each pixel element 10 are combined by the electronics to form a second image (showing the intensity of energy in the second frequency band f2).

Pixel element 10 may also be configured to detect more than two frequency bands without departing from the scope of the present teachings. A system for imaging in N different frequency bands would have N resonant apertures 14 in each pixel element 10. In the illustrative embodiment of FIG. 1, one detector 12 is placed within (and/or below) each resonant aperture 14. An N-band detector would therefore have N detectors 12 per pixel element 10, one detector element 12 under each aperture 14. Multiple detectors 12 can also be placed under each resonant aperture 14 without departing from the scope of the present teachings.

Note that an incident signal of frequency f1 may be detected by detector 12A. In this case, the efficiency is higher than of conventional filtering techniques where detected power is incident power divided by the number of filtering elements. Additionally, the noise is reduced by virtue of the smaller area of the absorber elements.

In the embodiment of FIG. 1, pixel element 10 is configured as a dual-band polarized detector with two resonant apertures 14A and 14B, which are in the form of slots. The apertures 14A and 14B effectively detect light polarized parallel to the short axes of the slots. Each aperture 14A, 14B has a different length that determines the sub-band frequency that is filtered through that aperture 14.

The width of each aperture 14 may be configured to provide a desired bandwidth. Generally, the wider the aperture, the wider the bandwidth of the resonance. This leads to a higher power transmitted through aperture 14 because a greater fraction of the incident spectrum is funneled through it at resonance. Ideally, one wants to trade off the power against frequency discrimination. For example, if BW is the resonant full width half maximum (FWHM) bandwidth of the apertures and $\Delta f = f_2 - f_1$ is the frequency separation of the two resonances for a dual-band detector, then the aperture width should be chosen such that $BW < \Delta f/2$. Thus, the larger $\Delta f$ is, the wider the apertures can be and still achieve frequency discrimination between the apertures.

Polarized light incident on pixel element 10 at the aperture's resonant frequency is transmitted through that aperture 14. The resonant frequency $f_i$ for a given aperture i may be determined according to equation (1) as follows:

$$f_i = \frac{c}{2L_i\sqrt{\varepsilon}} \quad (1)$$

where c is the speed of light, $L_i$ is the length of aperture i, and $\varepsilon$ is the effective permeability of the pixel structure 10.

In one embodiment, at least two apertures 14A, 14B having different lengths are located in a plane, and the lengths are selected to define resultant resonant frequencies for each of the detectors. Substantially all of the light within each frequency sub-band that is incident on the full pixel area 10 is transmitted though its respective resonant slot and is detected by the respective sub-wavelength detector element 12A, 12B. As shown in FIG. 1, first aperture 14A has a length $L_1$ and transmits a frequency band centered around a resonant frequency $f_1$. Likewise, second aperture 14B has a length $L_2$ and transmits a frequency band centered around a resonant frequency f2.

In FIG. 1, resonant apertures 14 are in the shape of straight slots. It will be appreciated that apertures 14 may also be formed in other shapes without departing from the scope of the present teachings. For example, resonant apertures 14 could also be formed in a bowtie pattern, a crossed bowtie pattern, or a crossed slot pattern, for example, as disclosed in co-pending U.S. patent application Ser. No. 11/981,203 filed on Oct. 31, 2007, entitled "MULTIPLE-BAND DETECTOR USING FREQUENCY SELECTIVE SLOTS," and corresponding co-pending International (PCT) Patent Application No. PCT/US2008/081698 filed on Oct. 30, 2008, the entire contents of each of which are incorporated herein by reference. A bowtie aperture, for example, may have electric fields as much as 50% higher than an equivalent slot aperture, as the bowtie pattern confines the electric field more towards the center of the aperture as compared to a straight slot. This higher field concentration allows the detector 12 to be reduced in size and still absorb as much power (as a larger detector size 12 with a straight slot aperture).

Figure 2:
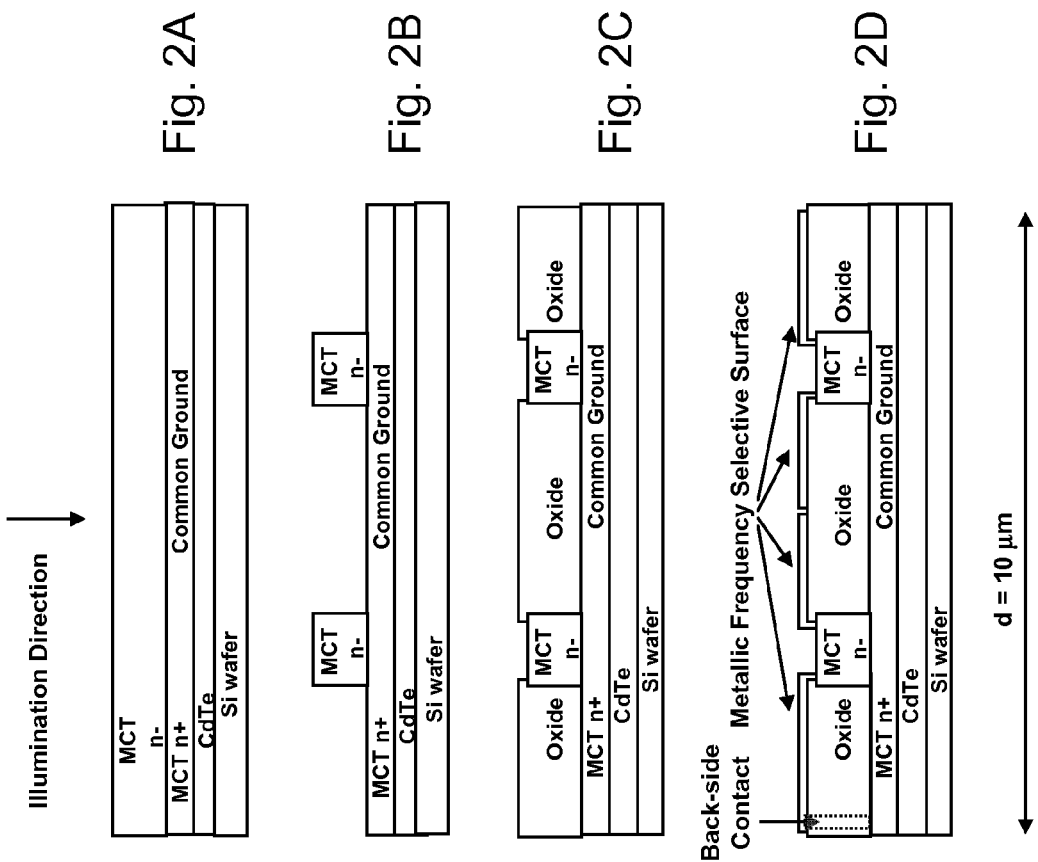
FIG. 2 shows an exemplary method for fabricating the a multiband sub-wavelength infrared detector element, according to an embodiment.

FIG. 2 shows a side view of the fabrication process for forming a detector element, in detail, in accordance with an embodiment.

The process begins in step 210 (FIG. 2A). In order to build the mercad telluride layer on the silicon wafer, an intermediate cadmium telluride (CdTe) layer may be first epitaxially grown on the silicon wafer. A 7 μm thick CdTe layer, for example, provides lattice matching between the silicon wafer and a II-VI ternary alloy $Hg_{(1-x)}Cd_xTe$:n+ semiconductor layer. Fabrication continues with an epitaxially grown conductive layer formed on top of a single crystal silicon wafer providing a common ground for the backside of the detector element. In one embodiment, a mercad telluride $Hg_{(1-x)}CdxTe$:n+ layer provides a common ground plane which may be approximately 10 µm thick. The common ground plane may further be doped with indium, for example, up to $10^{18}$ atoms/cm$^3$ to achieve conductivity via n$^+$ doping.

Subsequently, an IR absorbing material may be formed over the common ground. A II-VI ternary alloy semiconductor, such as mercad telluride $Hg_{(1-x)}Cd_xTe$ may be provided. The absorption properties of mercad telluride may be selectively tuned by varying the alloy composition. For example, $Hg_{(1-x)}Cd_xTe$ has an intrinsic direct bandgap which can be varied from 0 eV (x~0.15) to 1.6 eV (x~1.0). A bandgap of 0.1 eV appropriate for 8-12 µm absorption may be obtained using an alloy composition where x is approximately 0.21.

Epitaxial growth of a II-VI ternary alloy semiconductor is disclosed, for example, in U.S. Pat. No. 5,399,206 entitled "ARSENIC PASSIVATION FOR EPITAXIAL DEPOSITION OF TERNARY CHALCOGENIDE SEMICONDUCTOR FILMS ONTO SILICON SUBSTRATES," herein incorporated by reference in its entirety.

In one embodiment, a 2-3 µm thick mercad telluride $Hg_{(1-x)}Cd_xTe:n^-$ layer (x~0.21) may be subsequently grown on the $Hg_{(1-x)}Cd_xTe:n^+$ and forms the IR absorber material for the detectors. This layer having indium doping of $10^{15}$ atoms/cm$^3$ via n$^-$ doping may have a tailored bandgap that is sensitive over the 8-12 µm wavelength range. Alternatively, gallium or other dopants might also be used instead of indium.

In step 220 (FIG. 2B) sub-wavelength absorber mesas are then patterned via lithography techniques and formed by dry etching the IR absorber layer. Dry etching processes which may be adapted for use are described, for example, by R. C. Keller et. al. "Reaction Chemistry and Resulting Surface Structure of HgCdTe Etched in $CH_4/H_2$ and $H_2$ ECR Plasmas" J. Electron. Mater. 24, 1155 (1995); R. C. Keller et. al. "Dry Etching of $Hg_{1-x}Cd_xTe$ Using $CH_4/H_2/Ar/N_2$ Electron Cyclotron Resonance Plasmas" J. Electron. Mater. 25, 1270 (1996); and J. D. Benson et. al. "The Influence of Photoresist Feature Geometry on ECR Plasma Etched HgCdTe Trenches" SPIE vol. 4795 (2002) p. 129, which are herein incorporated by reference in their entirety.

In the case of a dual band detector for IR applications of 8-12 µm, two mesas per pixel may be formed. It will be appreciated that in other embodiments, additional mesas may be similarly formed, if so desired. Each pixel is of unit cell size d, where d is approximately 6-10 µm. The sub-wavelength mesas are dry etched to approximately L$^3$. Current manufacturing techniques permit L to be approximately 2-3 µm, although efforts are underway for L to be about 1 µm.

Next, in step 230 (FIG. 2C), to provide isolation for the metallic surface from the common ground plane layer, an oxide may be formed over the entire surface of the common ground layer between the mercad telluride mesas. In one implementation, the insulating layer may be silicon oxide ($SiO_2$). This insulating layer may be formed by an oxide deposition process, for example, by a plasma-enhanced chemical vapor deposition (PECVD) process. More particularly, the region may be patterned and the oxide is etched resulting in periodic areas of isolation.

Continuing to step 240 (FIG. 2D), a metallic surface may be subsequently evaporated and patterned on top of the oxide. This metallic surface forms a frequency selective surface having dipole antennas which selectively focus incident radiation down to sub-wavelength dimensions to be absorbed by the IR absorber materials.

Additional ohmic contact to each sub-wavelength pixel is made through contact to the front metal surface above each absorber element. In one implementation, a wirebonding process may be used. A voltage bias may be provided through the front side ohmic contact and current flows from the front side patterned metal through the absorber element and out through the backside common ground ohmic contact.

Prior to the formation of the metallic surface, a via may be "opened up" or etched in the oxide layer to provide access to the common ground layer. Subsequently, a metal post, for example, of gold (Au), may be formed through an evaporation process to provide ohmic contact between the frequency selective surface and the common ground layer which is in direct contact with the backside of each IR absorber element but not in contact with the front side metallic surface.

To generate the metallic surface (i.e., forming the resonant dipole antenna structures) on top of the device, a metal, such as gold (Au) may be evaporated over the surface of the oxide. The metal may be patterned and "lifted-off" to provide to provide the periodic dual aperture per pixel topology. For detecting IR radiation between 8-12 µm, apertures may be formed having a width approximately of 0.3 µm and length of approximately 5-6 µm, with the apertures differing in length from each other by approximately 0.5 µm.

Figure 3:
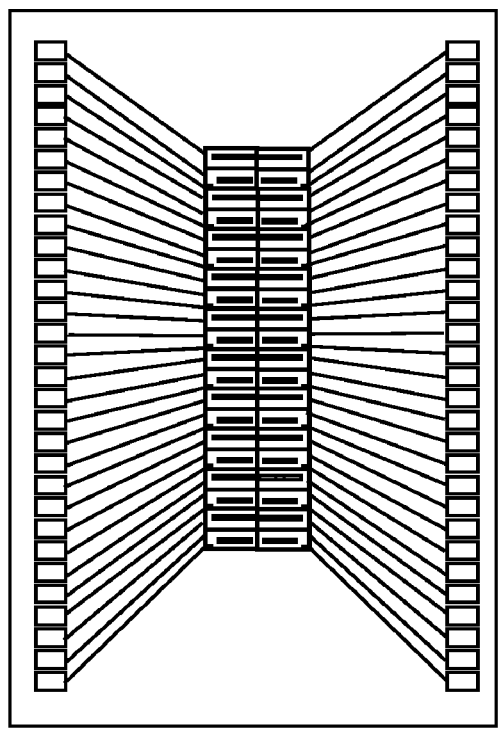
FIG. 3 shows an exemplary readout schematic for a dual-band sub-wavelength detector element, according to an embodiment.

FIG. 3 shows an exemplary readout scheme for a dual-band sub-wavelength IR detector, in accordance with an embodiment. The readout may include measurements of current flow or voltage drop across individual absorbers. In one embodiment, the readout configuration may be a small arrays of 2 rows×N columns of detector elements 10 (FIG. 1). For larger arrays, an embodiment may be used as disclosed, for example, in the co-pending application Ser. No. 12/433,576, filed Apr. 30, 2009, entitled "NANO-ANTENNA FOR WIDEBAND COHERENT CONFORMAL IR DETECTOR ARRAYS,", herein incorporated by reference in its entirety.

Space, airborne and surface-based infrared and visible imaging and remote sensing systems may benefit from this conformal nano-technology as it would result in higher performance, more producible infrared-visible imagers that are easier to integrate and deploy.

While this disclosure has been described in connection with what is presently considered to be the most practical embodiments, it is to be understood that it is capable of further modifications and is not to be limited to the disclosed embodiments, and this application is intended to cover any variations, uses, equivalent arrangements or adaptations of the disclosure following, in general, the principles of the disclosure and including such departures from the present disclosure as come within known or customary practice in the art to which the application pertains, and as may be applied to the essential features hereinbefore set forth and followed in the spirit and scope of the appended claims.

What is claimed is:

1. A multiband infrared (IR) detector array, comprising:
   a metallic surface having a plurality of periodic resonant structures, each periodic structure configured to resonantly transmit electromagnetic energy in a distinct frequency band; and
   a plurality of pixels each comprising two differently sized resonant slots corresponding to first and second wavelengths, respectively,
   wherein, for each pixel, the two differently sized resonant slots have respective first and second detectors associated therewith,
   wherein the two differently sized resonant slots are arranged such that essentially all of the electromagnetic energy at the first wavelength passes through a first one of the two differently sized resonant slots onto the first detector and essentially all of the electromagnetic energy at the second wavelength passes through a second one of the two differently sized resonant slots onto the second detector,
wherein the first and second detectors comprise mercad telluride.

2. The IR detector array of claim 1, wherein each periodic resonant structure is configured to collect energy incident on an area larger than said each periodic resonant structure and to focus said incident energy into a smaller localized area associated with a detector,
wherein focusing the energy incident on said larger area onto the smaller localized area of the detector reduces noise energy received by the detector so as to improve a signal-to-noise ratio associated therewith.

3. The IR detector array according to claim 2, wherein, for each pixel, said first and second resonant structures are positioned such that they collect energy incident on a larger substantially common area associated with the pixel.

4. The IR detector array of claim 1, wherein said first and second detectors comprise $Hg_{(1-x)}Cd_xTe$, where x is about 0.21.

5. The IR detector array according to claim 1, wherein the different sized slots comprise either rectangular slots, bowtie slots, crosses, or bowtie crosses.

6. The IR detector array of claim 1, wherein each of the plurality of pixels further comprise a third resonant structure corresponding to a third wavelength and having a third detector associated therewith, wherein the third resonant structure is arranged such that essentially all of the electromagnetic energy at the third wavelength passes through the third resonant structure onto the third detector.

7. The IR detector array of claim 6, wherein the first, second, and third resonant structures comprise differently sized resonant slots such that each of the resonant slots are resonant to electromagnetic energy at a different frequency.

8. A method of forming a multiband infrared (IR) detector array, the method comprising:
forming an IR absorber material on a substrate;
forming a plurality of mesas in the absorber material;
depositing an oxide layer on the substrate; and
forming a metallic surface on the oxide layer so as to define a pixel comprising a plurality of resonant apertures each having a different length associated therewith, wherein each resonant aperture is associated with a different one of the plurality of mesas,
wherein the different length of each aperture in the pixel is selected to be resonant at one of a plurality of different IR wavelengths.

9. The method of claim 8, further comprising:
forming a via in the oxide layer; and
filling the via with a conductive material so as to provide ohmic contact between the metallic surface and a common ground layer.

10. The method of claim 8, wherein the absorber material comprises mercad telluride.

11. The method of claim 8, wherein the IR absorber material comprises $Hg_{(1-x)}Cd_xTe$, where x is about 0.21.

12. The method of claim 8, wherein said forming the plurality of mesas comprises dry etching the absorber material to $L^3$, where L is approximately 2-3 μm.

13. The method of claim 8, wherein said forming the plurality of mesas comprises forming more than two mesas in the pixel.

14. A method of forming a multiband infrared (IR) detector array, the method comprising:
forming an intermediate layer of cadmium telluride over a substrate
forming an IR absorber material comprising mercad telluride on the substrate after forming the intermediate layer of cadmium telluride;
forming a plurality of mesas in the absorber material;
depositing an oxide layer on the substrate; and
forming a metallic surface on the oxide layer so as to define a pixel comprising a plurality of apertures each having a length associated therewith, wherein each aperture is associated with one of the plurality of mesas;
wherein the length of each aperture in the pixel is selected to be resonant to one of a plurality of different IR wavelengths.

15. A method of forming a multiband infrared (IR) detector array, the method comprising:
forming an IR absorber material on a substrate;
forming a plurality of mesas in the absorber material;
depositing an oxide layer on the substrate; and
forming a metallic surface on the oxide layer so as to define a pixel comprising a plurality of apertures each having a length associated therewith, wherein each aperture is associated with one of the plurality of mesas;
wherein the length of each aperture in the pixel is selected to be resonant to one of a plurality of different IR wavelengths; and
wherein said forming the IR absorber material comprises epitaxially growing the IR absorber material on a layer of $Hg_{(1-x)}Cd_xTe:n^+$.

* * * * *